United States Patent [19]
Wray et al.

[11] Patent Number: 5,507,014
[45] Date of Patent: Apr. 9, 1996

[54] RADIO TRANSMITTER CIRCUIT WITH TIME DEPENDANT INHIBITED TRANSMISSIONS

[75] Inventors: Anthony J. Wray; Stephen T. Valentine, both of Basingstoke, England

[73] Assignee: Motorola, Inc., Schaumburg, Ill.

[21] Appl. No.: 290,927

[22] PCT Filed: Feb. 25, 1993

[86] PCT No.: PCT/EP93/00429

§ 371 Date: Aug. 23, 1994

§ 102(e) Date: Aug. 23, 1994

[87] PCT Pub. No.: WO93/18602

PCT Pub. Date: Sep. 16, 1993

[30] Foreign Application Priority Data

Mar. 2, 1992 [GB] United Kingdom ............... 9204496

[51] Int. Cl.6 ............................................. H04B 1/04
[52] U.S. Cl. ..................... 455/115; 455/126; 455/129
[58] Field of Search ..................... 455/115–117, 119, 455/126, 127, 129

[56] References Cited

U.S. PATENT DOCUMENTS

4,491,973  1/1985  Idol ......................................... 455/115
5,175,879  12/1992 Ellingson et al. ....................... 455/126

FOREIGN PATENT DOCUMENTS

2213006  8/1989  United Kingdom .................. 455/126

*Primary Examiner*—Chi H. Pham

[57] ABSTRACT

A radio transmitter circuit is provided comprising: a power amplifier coupled to an antenna for transmission of radio signals; linearizer means, such as a Cartesian feedback linearizer or a predistortion equalizer, for compensating for non-linearity in the power amplifier; means for inputting a training sequence to the linearizer means and outputting a training signal from the power amplifier resulting from the training sequence; and a feedback circuit for feeding the training signal output from the power amplifier back to the linearizer means to adjust the linearizer means and/or feedback circuit. Means are provided for inhibiting transmission of radio signals through the antenna while the training signal is being output from the power amplifier.

11 Claims, 2 Drawing Sheets

5,507,014

RADIO TRANSMITTER CIRCUIT WITH TIME DEPENDANT INHIBITED TRANSMISSIONS

FIELD OF THE INVENTION

This invention relates to a radio transmitter having a power amplifier incorporating linearization which uses a training sequence.

BACKGROUND TO THE INVENTION

Continuing pressure on the limited radio spectrum available for radio communication systems is focusing attention on the development of spectrally efficient linear modulation schemes. Recent studies of digital mobile radio systems propose the use of linear modulation methods such as QPSK and π/4 QPSK which are considered to improve spectrum efficiency. The schemes, however, require a highly linear power amplifier or distortion will lead to intermodulation products, i.e. adjacent channel interference or "splatter". In the field of private mobile radio, stringent restrictions are placed on out-of-band emissions.

There is a demand for a strict linearity performance in power amplifiers.

SUMMARY OF THE PRIOR ART

A known linearization method in power amplifiers particularly suitable in the private mobile radio environment is that of Cartesian feedback, the linearizing of the power amplifier requires the accurate setting of the phase and amplitude of a feedback signal. In such known systems, a training sequence is transmitted, during which time the operation of the Cartesian feedback loop, is measured and the gain and phase are adjusted. The pahse is adjusted to ensure stability and the gain is monitored and adjusted to optimise efficiency and avoid saturation. The training sequence is ignored at the receiver.

The problem with such known systems is that a finite amount of time is allocated to the training sequence to be transmitted. In time division multiple access systems, the allocating of a finite amount of air time for training is a particularly costly overhead which reduces overall system throughput.

It is also a problem that, during the training sequence, a search is made for the optimum amplitude setting of the amplifier for maximum efficiency of operation. During this search, the amplifier is pushed into a saturation or "clip" mode at which linearity is lost and out of band spectral emissions are generated.

SUMMARY OF THE INVENTION

According to the present invention, a radio transmitter circuit is provided comprising: a power amplifier coupled to an antenna for transmission of radio signals; linearizer means for compensating for non-linearity in the power amplifier; means for inputting a training sequence to the linearizer means and outputting a training signal from the power amplifier resulting from the training sequence; and a feedback circuit for feeding the training signal output from the power amplifier back to the linearizer means to adjust the linearizer means and/or feedback circuit; characterized by means for inhibiting transmission of radio signals through the antenna while the training signal is being output from the power amplifier.

The means for inhibiting preferably comprise switching means and a load, for switching the signal from the power amplifier to the load when the training sequence is being output and for switching the signal to the antenna at the end of the training sequence.

A circulator may be provided coupled between the output of the power amplifier and the switching means and coupled to the load, for directing the output of the power amplifier to the switching means and for directing signals reflected from the switching means to the load. In another embodiment, the switching means is a multi-way switch coupled to the output of the power amplifier and to the antenna and the load, for selectively switching the signal from the output of the power amplifier to the antenna and the load.

Receive circuitry may be provided coupled to the switching means and a multi-way switch coupled to the output of the power amplifier and to the receive circuitry, for selectively switching the output from the power amplifier to the antenna and a received signal from the antenna to the receive circuitry.

Switching means control means are preferably provided for causing the switching means to switch the signal to the antenna in a gradual manner to avoid splatter.

The linearizer means may be a Cartesian feedback linearizer or a predistortion linearizer.

The feedback circuit preferably provides open loop phase adjustment followed by closed loop gain adjustment.

A preferred embodiment of the invention will now be described, by way of example, with reference to the drawings.

DETAILED DESCRIPTION OF DRAWINGS

Figure 1A:
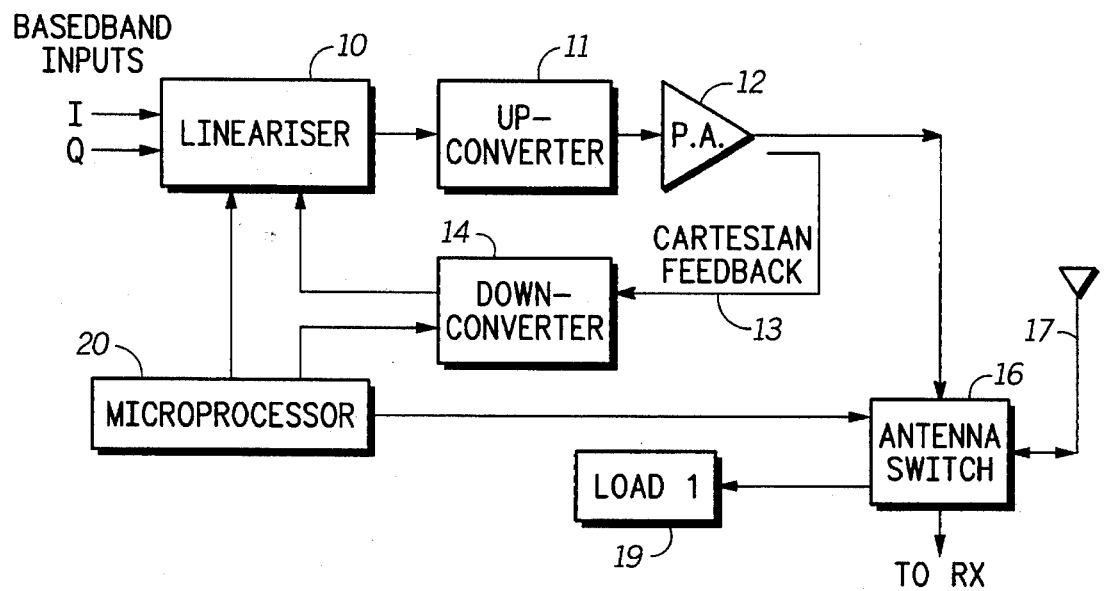
FIGS. 1A–1B show block diagrams of a transmitter in accordance with the preferred embodiment of the invention.
Figure 1B:
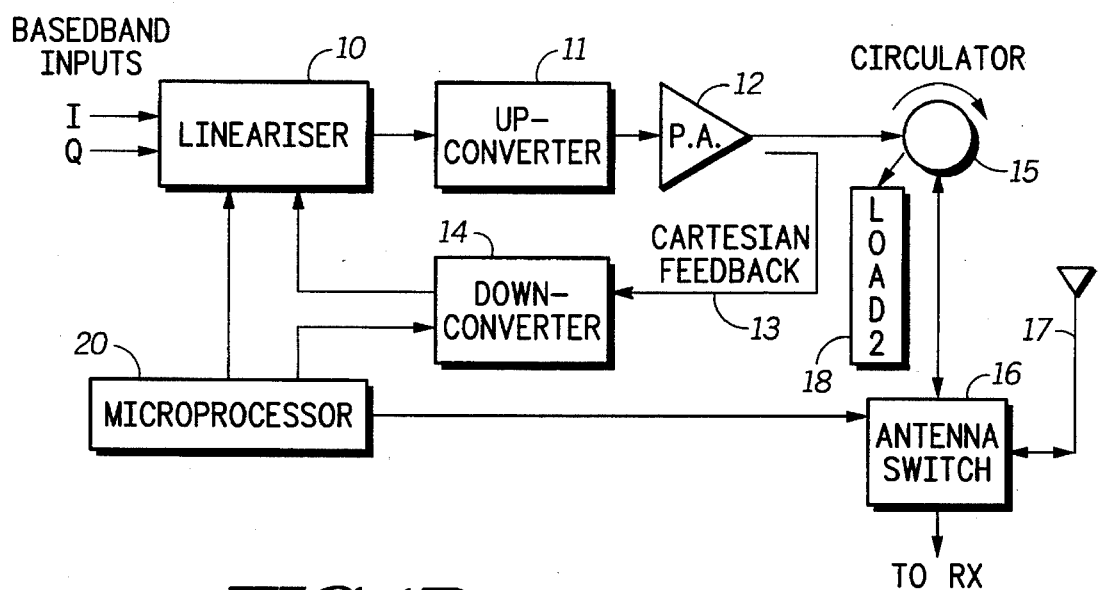

Referring first to FIGS. 1A–1B, block diagrams of a transmitter in accordance with the preferred embodiment of the invention are shown.

FIG. 1A shows a transmitter comprising a linearizer 10, an upconverter 11, a power amplifier 12, a feedback path 13, and a down converter 14. Connected to the output of the power amplifier 12 is an antenna switch 16 connected to an antenna 17. A first load 19 is shown connected to the antenna switch 16. A microprocessor 20 controls the operation of the linearizer 10 and antenna switch 16 for selectively routing transmissions from the power amplifier 12 to the first load 19 or the antenna 17. The microprocessor 20 also controls the phase of the downconverter 14.

FIG. 1B shows a transmitter comprising a linearizer 10, an upconverter 11, a power amplifier 12, a feedback path 13, and a down converter 14. Connected to the output of the power amplifier 12 is a circulator 15 connected to an antenna switch 16 connected to an antenna 17. A load 18 is shown connected to the circulator 18. A microprocessor 20 controls the operation of the linearizer 10 and antenna switch 16 for selectively routing transmissions from the power amplifier 12 to the antenna switch 16 and back to the load 18 via the circulator 15 or to the antenna 17. The microprocessor 20 also controls the phase of the downconverter 14. As is described below, it is an option to include both load 18, first load 19 and the circulator 15 in a single transmitter arrangement. Details of an appropriate linearizer are described in the paper "Transmitter Linearization using Cartesian Feedback for Linear TDMA Modulation" by M Johansson and T Mattsson 1991 IEEE.

Figure 2:
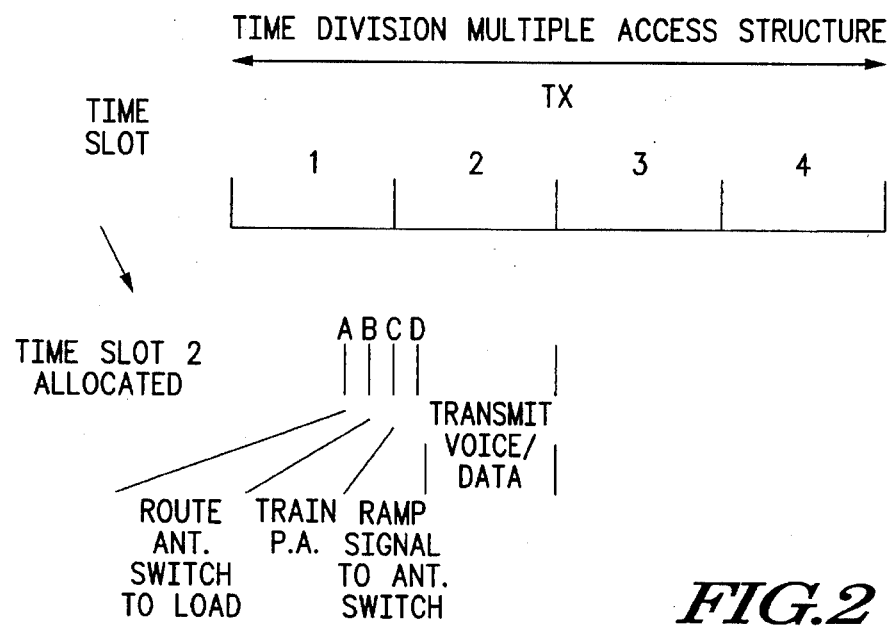
FIG. 2 shows the timing format of certain operations of the preferred embodiment of the invention in a time division multiple access scheme.

The operation of the circuit will be described with reference to FIG. 2, in which there is shown four transmit time slots (not to scale). The example will be described where transmit timeslot 2 is selected for transmission.

At a moment in time A in advance of the timeslot, microprocessor 20 causes antenna switch 16 to switch to the load 19. At point B, a training sequence is input to the linearizer 10 in the form of I and Q samples and is transmitted by the power amplifier 12. This training sequence is described in U.S. Pat. No. 5,066,923 of Motorola Inc. and illustrated in FIG. 3. The transmitted signal is fed directly to the load 19. The load is a matched resistor network with a heat sink if necessary. During this period, there is Cartesian feedback on feedback loop 17 which is downconverted in demodulator 14 and a phase comparison is made in the linearizer 10 between the input signal and the feedback signal. A phase shift adjustment is made in the downconvertor 14 in the feedback path so as to optimise the loop phase around the loop to ensure stable operation. When the phase is optimised, the feedback loop provided by feedback path 13 can be closed with the input to the linearizer to provide closed loop operation. Until the phase has been optimised, closed loop operation cannot commence, because of the likelihood of oscillation. Once the phase has been adjusted, the gain in the linearizer 10 can be adjusted for maximum efficiency of operation, by increasing the gain until the amplifier enters the "clip" mode. Once this threshold has been detected, the limit of operation of the overall amplifier is set and the amplifier is ready to transmit voice or data. The detecting of this threshold and backing off of the amplifier at the clip point is described in U.S. patent application Ser. No. 5,606,679, attached hereto as Annex 1.

At point C, a signal is sent from the microprocessor 12 to the antenna switch 16 in the form of a raised cosine ramp or other suitable ramp signal to gradually open the antenna switch and allow the signal from the power amplifier to be transmitted to the antenna 17. At point D, the antenna switch is fully opened and the voice or data to be transmitted is transmitted on the time slot through the antenna.

As an alternative to using antenna switch 16 and load 19, circulator 15 and load 18 can be used in conjunction with antenna switch 16 and, when antenna switch 16 is closed to the antenna, the training sequence transmitted from the power amplifier 12 is reflected back from the antenna switch 16 to the circulator 15 from which it passes to the load 18.

As an alternative to using Cartesian feedback, a predistortion type of linearizer can be used as described in the paper "Linear Amplification Technique for Digital Mobile Communications" by Y Nagata 1989 IEEE. In this case the downconverter 14 includes a demodulator and instead of setting the gain and phase of the loop, the input signal to the linearizer is distorted.

Thus, there has been described an arrangement in which training is carried out in a TDMA timeslot prior to that allocated for transmission. Training of the power amplifier is performed "off-air" by dissipating the transmit energy into a load. Thus, no additional "on-air" time needs to be set aside for training. The transmitter is isolated from the antenna whilst training. This avoids spurious emissions into adjacent channels being transmitted on the transmitter.

The antenna switch 16 is opened at the end of the training sequence (which typically has a duration of 1.2 ms), but the antenna switch can equally be opened as soon as the clip point has been determined and the gain has been backed off. It is of no consequence that the end of the training sequence may be transmitted, provided that there is no splatter onto the adjacent channel and provided that the transmission corresponds to the timeslot allocated.

Figure 3:
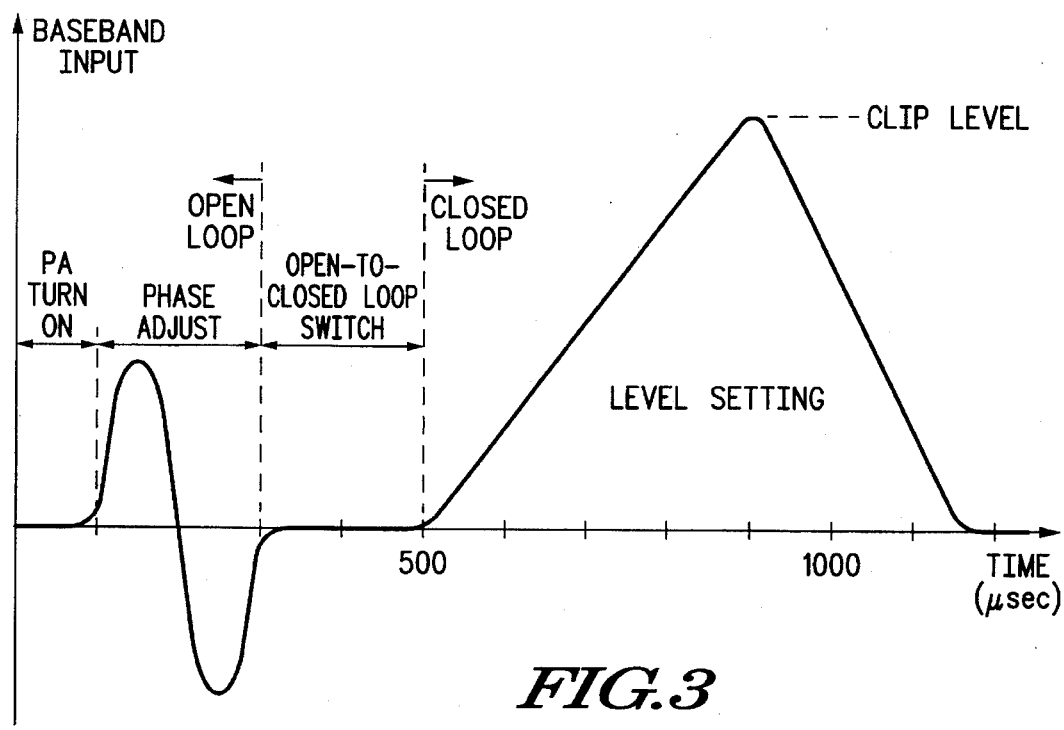
FIG. 3 shows a suitable training sequence for the operations represented in FIG. 2.

In place of a training seqence as shown in FIG. 3, other training sequences can be devised and indeed, almost any sequence of data could be used, the important feature being that the data fed back can be compared with the data input to measure the loop phase and/or gain. User data or voice should not be used as it will be lost into the load 18 or 19.

Instead of a load 18 or 19, an adjacent channel receiver can be used to receive the training sequence, as described in copending patent application Ser. No. 08/146,553 . . . entitled "R.F. Power Amplifier with Linearization" filed on the same date as the present application.

We claim:

1. A radio transmitter circuit comprising:

a power amplifier coupled to an antenna for transmission of radio signals;

a linearizer circuit operably coupled to an input of the power amplifier for compensating for non-linearity in the power amplifier;

a processing device operably coupled to the linearizer circuit for inputting a training sequence to the linearizer circuit in a first period of time which causes the outputting of a training signal from the power amplifier resulting from the training sequence; and a feedback circuit for feeding a first portion of the training signal output from the power amplifier back to the linearizer circuit to adjust the linearizer circuit and/or feedback circuit; characterized by a signal inhibiting circuit operably coupled to the output of the power amplifier and operably coupled to and responsive to the processing device for periodically and selectively inhibiting transmission of second portions of the training signal during a first period of time through the antenna prior to non-inhibited transmissions of non-training radio signals from the antenna during a subsequent second period of time.

2. A radio transmitter circuit according to claim 1, wherein the radio transmitter circuit transmits time divided information, and the signal inhibiting circuit further comprises a switch operably coupled to a first load and an antenna, and wherein the processing device controls a periodic and selective switching operation of the switch corresponding to time divided operations of the radio transmitter for switching the training signal from the output of the power amplifier to the first load in the first period of time and for switching time divided information radio transmissions to the antenna in the second period of time.

3. A radio transmitter circuit according to claim 2, wherein the switch is a multi-way switch coupled to the output of the power amplifier and to the antenna and the first load, for selectively switching the signal from the output of the power amplifier between the antenna and the first load.

4. A radio transmitter circuit according to claim 2 further comprising receive circuitry coupled to the switch, wherein the switch is a multi-way switch coupled to the output of the power amplifier and to the receive circuitry, for selectively switching the output from the power amplifier to the antenna and a received signal from the antenna to the receive circuitry.

5. A radio transmitter circuit according to claim 2 wherein the processing device operably coupled to the switch controls the operation of the switch and causes the switch to route the radio signal to the antenna in a gradual manner to avoid splatter.

6. A radio transmitter circuit according to claim 1, wherein the linearizer circuit is a Cartesian feedback linearizer.

7. A radio transmitter circuit according to claim 1, wherein the linearizer circuit is a predistortion linearizer.

8. A radio transmitter circuit according to claim 1, wherein the feedback circuit provides open loop phase adjustment followed by closed loop gain adjustment.

9. A radio transmitter circuit according to claim 3 further comprising receive circuitry coupled to the switch, wherein the switch is a multi-way switch coupled to the output of the power amplifier and to the receive circuitry, for selectively switching the output from the power amplifier to the antenna and a received signal from the antenna to the receive circuitry.

10. A radio transmitter circuit comprising:

a power amplifier coupled to an antenna for transmission of radio signals;

a linearizer circuit coupled to an input of the power amplifier for compensating for non-linearity in the power amplifier;

a processing device operably coupled to the linearizer circuit for inputting a training sequence to the linearizer circuit which causes the outputting of a training signal from the power amplifier resulting from the training sequence;

a feedback circuit for feeding the training signal output from the power amplifier back to the linearizer circuit to adjust the linearizer circuit and/or feedback circuit; and characterised by:

a signal inhibiting circuit for inhibiting the training signal from the antenna while the training signal is being output from the power amplifier, wherein the signal inhibiting circuit comprises a switch for isolating the antenna from the output of the power amplifier during the training sequence thereby reflecting the training signal; and a signal directing element coupled between the output of the power amplifier and the switch and operably coupled to a load, for directing the output of the power amplifier to the switch and for directing signals reflected from the switch to the second load.

11. A radio transmitter circuit according to claim 10 further comprising receive circuitry coupled to the switch, wherein the switch is a multi-way switch coupled to the output of the power amplifier and to the receive circuitry, for selectively switching the output from the power amplifier to the antenna and a received signal from the antenna to the receive circuitry.

* * * * *